(12) United States Patent
Paterno

(10) Patent No.: US 7,042,382 B1
(45) Date of Patent: May 9, 2006

(54) METHOD OF TIME SYNCHRONIZATION OF MULTIPLE A/D SAMPLE DATA RECORDS

(75) Inventor: Robert M. Paterno, Richmond, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/134,602

(22) Filed: May 19, 2005

(51) Int. Cl.
*H03M 1/60* (2006.01)

(52) U.S. Cl. ..................... 341/155; 341/131
(58) Field of Classification Search ......... 341/130–160
See application file for complete search history.

(56) References Cited

U.S. PATENT DOCUMENTS

| | | | |
|---|---|---|---|
| 4,196,405 A | 4/1980 | Le Dily et al. | 333/16 |
| 4,574,354 A | 3/1986 | Mihalik et al. | 364/481 |
| 4,829,543 A | 5/1989 | Borth et al. | 375/83 |
| 5,068,873 A | 11/1991 | Murakami | 375/13 |
| 6,037,780 A | 3/2000 | Ohtaki | 324/535 |
| 6,356,850 B1 | 3/2002 | Wilstrup et al. | 702/69 |
| 6,404,364 B1 * | 6/2002 | Fetterman et al. | 341/155 |
| 6,477,238 B1 | 11/2002 | Schneider et al. | 379/22.04 |
| 6,629,041 B1 | 9/2003 | Marbach | 702/30 |
| 6,646,583 B1 * | 11/2003 | Fossum et al. | 341/144 |
| 6,787,752 B1 * | 9/2004 | Tsai | 250/208.1 |
| 6,911,641 B1 * | 6/2005 | Tsai | 250/208.1 |

OTHER PUBLICATIONS

IEEE Transaction on Communications, vol. 49, No. 3. pp. 554-562, "Design Methods for Time-Domain Equalizers in DMT Transceivers", Farhang-Boroujeny et al., "no month" "no year".

* cited by examiner

*Primary Examiner*—Lam T. Mai
(74) *Attorney, Agent, or Firm*—Gerhard W. Thielman, Esq.; Scott R. Boalick, Esq.; Matthew J. Bussan, Esq.

(57) ABSTRACT

Multiple analog inputs are converted to respective multiple digital data records by analog to digital converters. A switch inserts a pseudorandom "alignment" code into each analog input at the beginning of conversion. After the analog to digital conversion, this pseudorandom code is detected by correlator filters to time align the plurality of digital data record with one another. The insertion of the pseudorandom code allows multiple analog inputs to be digitally converted in synchronization with one another. The disclosed logic controls its trigger timing and operation method.

18 Claims, 5 Drawing Sheets

METHOD OF TIME SYNCHRONIZATION OF MULTIPLE A/D SAMPLE DATA RECORDS

STATEMENT OF GOVERNMENT INTEREST

The invention described herein was made in the performance of official duties by an employee of the Department of the Navy and may be manufactured, used, licensed by or for the Government for any governmental purpose without payment of any royalties thereon.

TECHNICAL FIELD

The present invention relates to analog to digital converters and, more particularly, relates to time alignment of the data record outputs of multiple analog to digital converters.

BACKGROUND

Many engineering applications use analog to digital (A/D) converters to translate signals from analog form to digital form. Analog to digital converters typically employ sophisticated processing algorithms to improve performance. In many cases, multiple analog to digital converters are employed to digitize multiple analog input channels. When multiple analog to digital converters are used, the relative occurrence in time of the data between data streams is of utmost importance for achieving the desired processing performance in many applications. Most readily available analog to digital converter products make available to the user an external trigger for this purpose. It is difficult for each analog to digital converter to consistently begin acquisition in exact synchronism with the other analog to digital converters in the system. This requirement for consistent single-clock trigger accuracy severely narrows the choice of available products, and in some cases it cannot be done without custom hardware design specific to the particular brand of analog to digital converter.

Known analog to digital converter acquisition systems depend primarily on three external user supplied inputs. These are:

1) the external sampling clock which is piped directly to the analog to digital converter and is usually uninterruptible;

2) the external trigger which is usually clock qualified, processed by onboard logic, and eventually used to trigger other circuitry to begin storing successive analog to digital conversions—usually for a programmable number of samples; and 3) the analog input to an analog to digital converter which is the input to be digitized.

In the case of multiple analog channel conversions, if one analog to digital converter produces an output before the others, errors result. When multiple analog to digital converters are setup to acquire multiple parallel analog inputs synchronously, problems can arise with high sample rates due to latency unknowns, variation, drift, and meta-stability with the externally supplied triggers. The resulting analog to digital sample records are then offset by some unknown, and possibly random, number of analog to digital clock cycles from both the common trigger instant and one another, and this creates an apparent large jitter problem which severely degrades the performance of many kinds of phase sensitive data processing.

An analog to digital converter is needed less prone to this error condition. Such analog to digital converter accuracy is an absolute necessity in many digital signal processing applications such as radar and sonar.

SUMMARY

The present invention may facilitate synchronization in time of sample records acquired from multiple analog to digital converters, obviate the need for custom trigger synchronization hardware, perform data record alignment in post-processing, perform data record alignment in software and analog to digital conversion in hardware, use a commercially available brand of analog to digital converter, use trigger lead cables that are not necessarily perfectly matched, successfully implement coherent integration and other forms of phase sensitive processing by satisfying the critical requirement of multiple channel analog to digital conversions that are time aligned, simplify system specifications, use a single common trigger synchronization system can be used throughout complex acquisition systems, and/or meet any degree of trigger alignment certainty using pseudorandom code length and correlation adapted in software.

An exemplary synchronization circuit for analog to digital converters has multiple analog to digital converters, a pseudorandom code generator, a plurality of switches and a plurality of correlator filters to allow multiple analog inputs to be converted to digital in synchronization with one another. The multiple analog to digital converters convert a respective plurality of analog signals to a respective plurality of digital data records, wherein the analog to digital converters are hardware converters of at least two different kinds of converters having different intrinsic propagation timing characteristics. The pseudorandom code generator generates a pseudorandom code. The plurality of switches connect between the plurality of analog signals and the plurality of analog to digital converters and connect between the pseudorandom code generator and the plurality of analog to digital converters to insert the pseudorandom code into the analog signals at a same time at a beginning of the conversion. The plurality of correlator filters receive respective digital data from the respective analog to digital converters, recognize the pseudorandom code in each of the respective plurality of digital records, and facilitate the exact location of autocorrelation maximum within the data record.

An exemplary method of synchronizing analog to digital converters converts a plurality of analog signals to a respective plurality of digital data records using a respective plurality of analog to digital converters, generates a pseudorandom code, and inserts the pseudorandom code into the respective analog signals at a same time prior to converting. The method correlation filters the respective digital data records from the respective analog to digital converters to recognize the pseudorandom code in each of the respective plurality of digital signals and outputs the respective digital signals time-aligned with one another. The plurality of analog to digital converters are triggered to begin converting and clocked together.

The present invention synchronizes multiple analog to digital converter channels independent of the particular analog to digital converter model, brand, or number used, and can easily be adapted to various clock rates or resolutions.

The details of the preferred embodiments of the inventions will be readily understood from the following detailed description when read in conjunction with the accompanying drawings.

DETAILED DESCRIPTION

Figure 1:
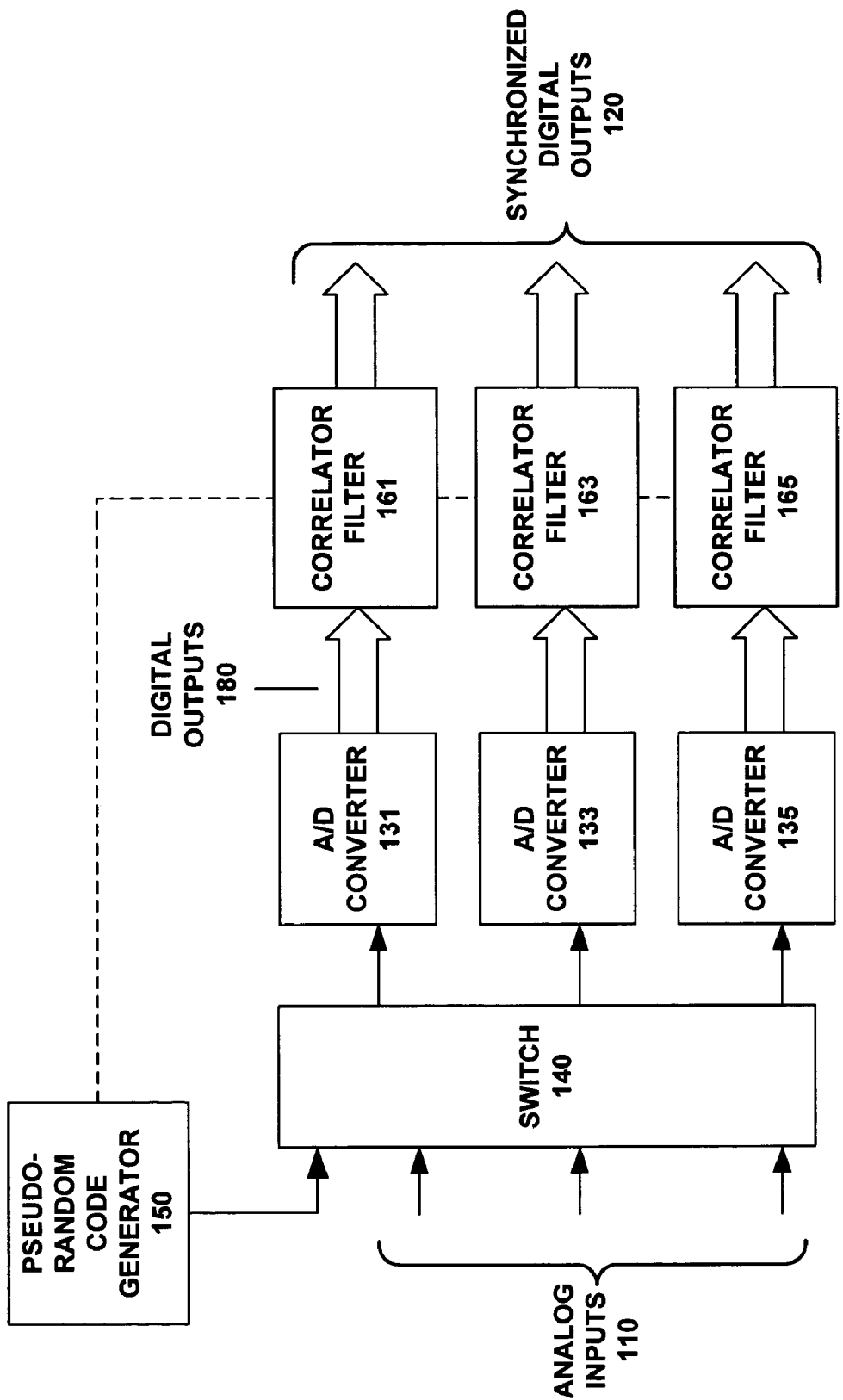
FIG. 1 illustrates a block diagram of an exemplary analog to digital converter.

FIG. 1 illustrates a block diagram of an exemplary analog to digital (A/D) converter. A plurality of analog inputs 110 are converted to a plurality of respective digital outputs 120 by the analog to digital converters 131, 133 and 135. A switch 140 connects to a pseudorandom code generator 150 and inserts a pseudorandom "alignment" code into each analog input 110. The pseudorandom code is inserted into each of the analog input streams at the beginning of conversion.

After conversion in the analog to digital converters 131, 133 and 135, this pseudorandom "alignment" code is detected by correlator filters 161,163 and 165. The correlator filters 161,163 and 165 receive the plurality of digital outputs 180 from the analog to digital converters 131,133 and 135 and receive the pseudorandom "alignment" code from the pseudorandom code generator 150. The correlator filters 161,163 and 165 time align the plurality of digital outputs 180 with one another using the detected pseudorandom "alignment" code. The correlation filtering of the correlator filters 161, 163 and 165 is best done by post-processing the stored data record from the conversion using standard digital signal processing techniques.

Although the disclosed embodiments illustrate three parallel analog to digital converter stages, two or four or more parallel analog to digital converter stages can be used. The insertion of a pseudorandom "alignment" code allows a plurality of analog inputs to be converted to digital in synchronization with one another.

Different intrinsic propagation timing characteristics of the different analog to digital converters 131,133 and 135 are compensated for by the pseudorandom "alignment" code of the present inventions. For example, one of the analog to digital converters may be of a different make or brand than the other and have different characteristics. Even the same brands or makes of converters often have different propagation timing characteristics from one another because of the complex multiplexing layers used today within the analog to digital converters. Additionally, cabling on an input side of the analog to digital converters sometimes have different line lengths and impedances from one another causing additional propagation time differences which can be compensated for by the present inventions when these test leads are placed between the switch 140 and the analog to digital converters 131,133 and 135.

Figure 2:
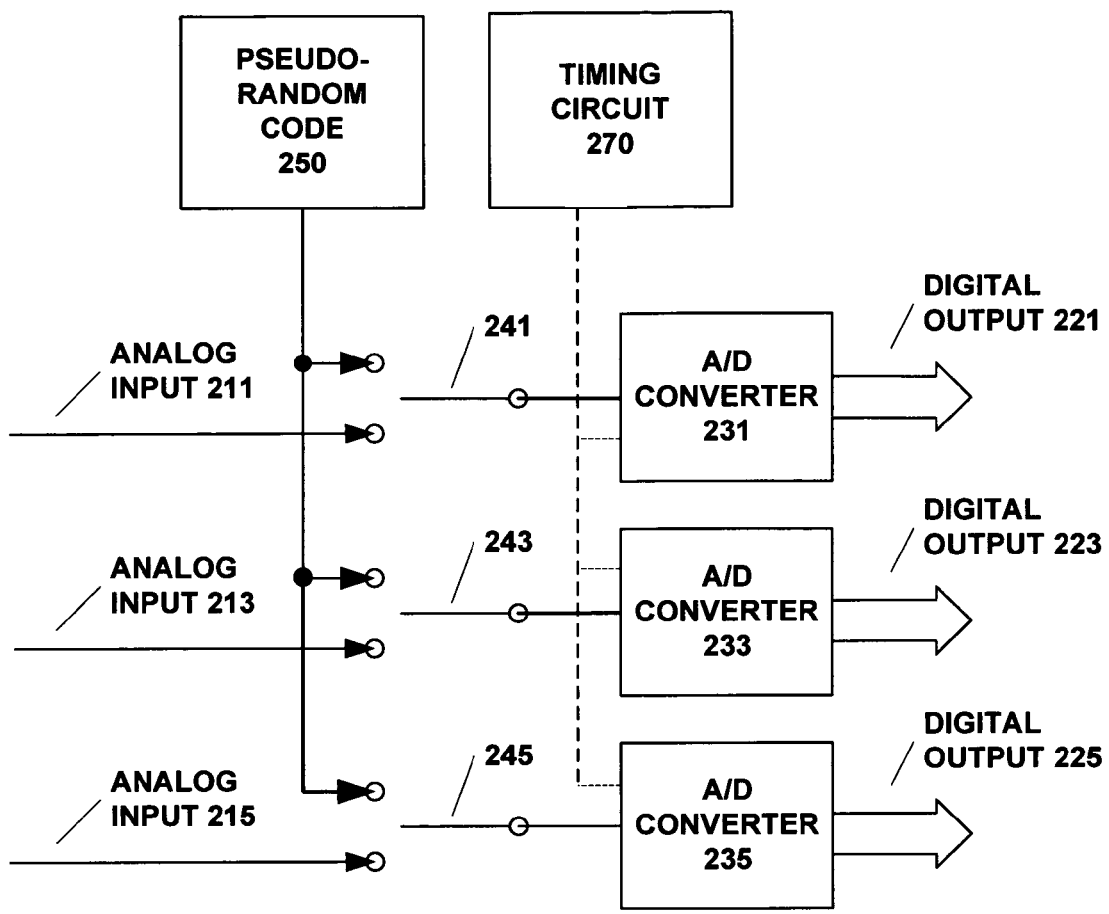
FIG. 2 illustrates an exemplary block diagram of a front-end, hardware portion an analog to digital converter.

FIG. 2 illustrates an exemplary block diagram of a front-end, hardware portion for an analog to digital converter. Switches 241, 243 and 245 are preferably high speed radio frequency (RF) single pole double throw switches. A surface mount transmission line from Hittite Microwave Corp. such as the HMC197 may be used to provide very high frequency performance, low insertion loss, high isolation, very large dynamic range, and very fast switching in less than 10 nanoseconds. These switches 241, 243 and 245 preferably default to the analog input channel position 211, 213, 215. Analog inputs 211, 213 and 215 arrive at the switches over matched low-loss cabling such as that available from W.L. Gore. The high speed switches 241, 243 and 245 switch a common serial pseudorandom code into the inputs of each analog to digital converter 231, 233 and 235. The high speed switches 241, 243 and 245 are preferably RF switches in order to switch RF signals. In other applications, the switches may not need to accommodate RF signals.

The pseudorandom code (PRC) is preferably a serial, maximal length digital code inserted upon receipt of a trigger (EXT TRIG). Attenuation is recommended on the pseudorandom code output 250 to accommodate the ever-shrinking full-scale analog to digital converter input voltage range.

The trigger and clock lines to the analog to digital converters and the lines from the switches to the analog to digital converters may be ECLinPS lines from ON Semiconductor. The analog to digital converters 231, 233 and 235 receive a common sampling reference clock. The switches 241, 243 and 245 delay application of the pseudorandom code to the analog inputs in accordance with a worst-case trigger latency of the individual analog to digital converters and this worst case latency is easily established from A/D specifications. This is a very simple specification which is easy to guarantee with high engineering confidence. Once the pseudorandom code transmission is complete, the switches redirect so that the external analog channels are connected to the inputs to the analog to digital converters. The conversion begins after triggers are applied to respective analog to digital converter trigger inputs. The digital outputs 221, 223 and 225 from the analog to digital converters 231, 233 and 235 preferably connect to a software computing apparatus such as a microcontroller, computer or digital signal processor.

Figure 3:
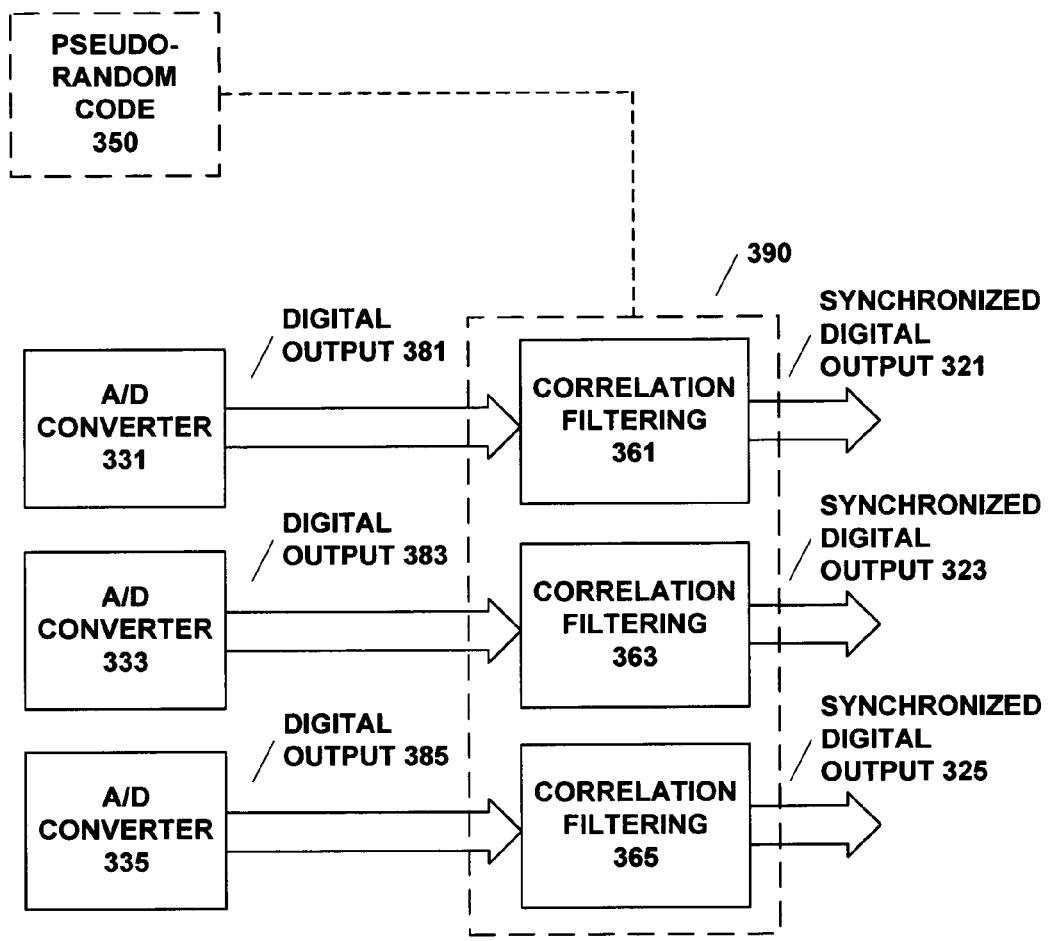
FIG. 3 illustrates an exemplary block diagram of a back-end, software portion for an analog to digital converter.

FIG. 3 illustrates an exemplary block diagram of a back-end, software portion for an analog to digital converter. A software computing apparatus 390 such as the microcontroller, computer or digital signal processor is illustrated to receive the digital outputs 381, 383 and 385 from analog to digital converters 331, 333 and 335. The correlation filtering 361, 363 and 365 is most expediently implemented by software in the computing apparatus 390. As an example, correlation filtering can be performed in a finite impulse response filter (FIR). The software has knowledge of the pseudorandom code 350 inserted in the analog input streams. The software performs a correlation to recognize this pseudorandom code 350 and time align the digital outputs 381, 383 and 385 and produce the synchronized digital outputs 321, 323 and 325. Although software implementation may be used, hardware filters could also be used.

Figure 4:
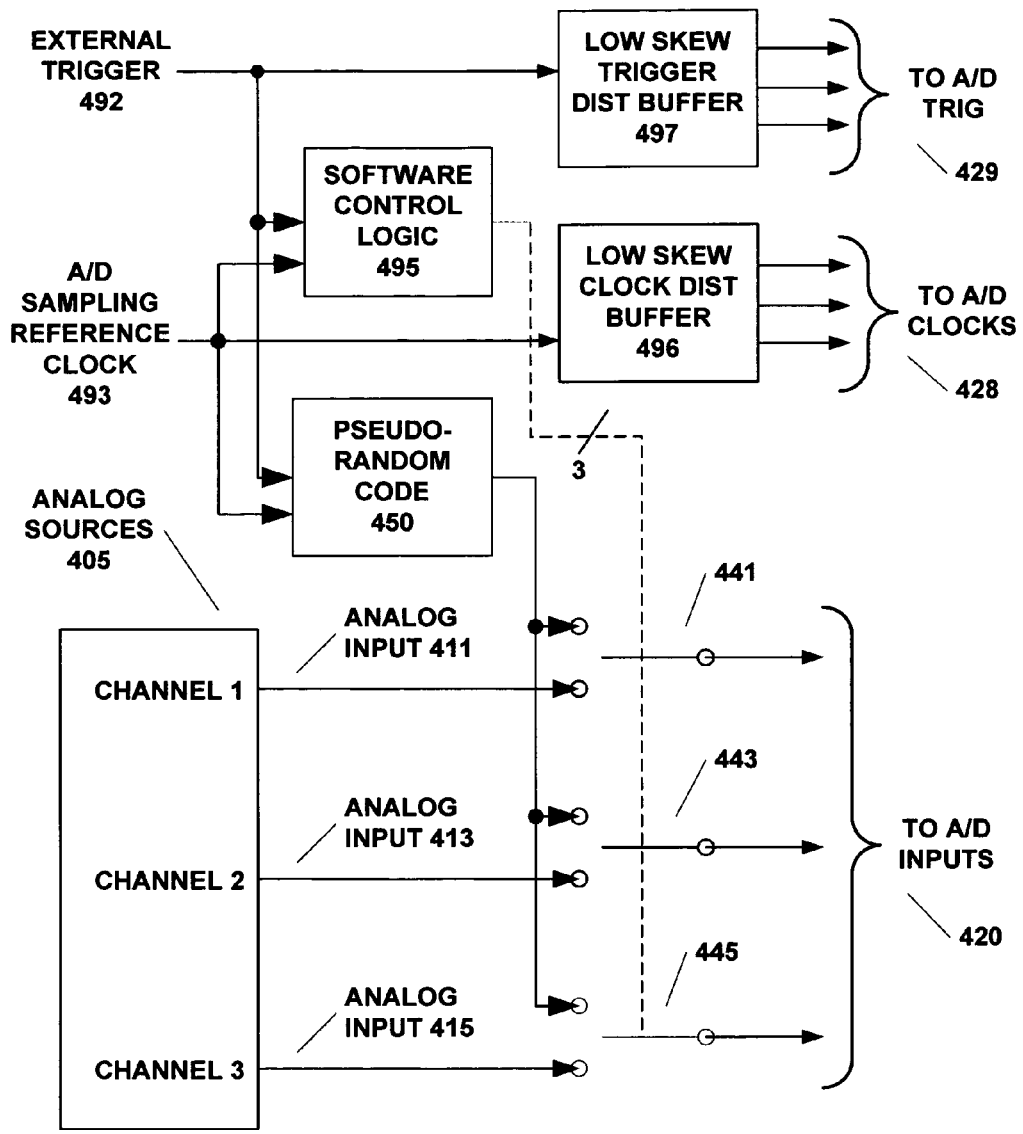
FIG. 4 illustrates an exemplary detailed block diagram of a front-end, hardware portion for an analog to digital converter.

FIG. 4 illustrates an exemplary detailed block diagram of a front-end, hardware portion for an analog to digital converter. Switches 441, 443 and 445 selectively connect either the channels 1–3 of analog sources 405 or the pseudorandom code 450 to the inputs 420 to the analog to digital converters under control of software control logic 495. Low skew clock distribution buffer 496 and low skew trigger distribution buffer 497 continuously drive the analog to digital converters in parallel via lines 428 and 429. Distribution buffers 496 and 497 are preferably single chip low propagation delay skew distribution drivers. Software control logic 495 waits a predetermined amount of time after an external trigger 492 for switches 441, 443 and 445 to close plus a worst-case analog to digital converter trigger latency plus a few extra clock cycles, and then initiates transmission of the pseudorandom code 450 into the analog to digital converter inputs 420. These switching operations are synchronous with a master analog to digital sampling reference clock 493. The edge rates and propagation delays of these components together with the extremely small acquisition apertures of today's analog to digital converters, such as the Maxim MAX108 and Atmel TS8388B used in certain Echotek products, result in a wide margin for reliable operation in this application.

The external trigger 492 will require a stable reference frequency and high edge rate logic, with well characterized propagation delay that can be guaranteed to remain within setup timing bounds of the emitter coupled logic (ECL) across all operating conditions. The actual implementation of the switches is more involved than illustrated in the appended drawings, in that it may be necessary to provide sufficient isolation of the logic circuit clock and other interference from the analog channel as dictated by switch isolation characteristics and analog to digital converter resolution. The construction of this circuit for those applications employing very high conversion clock rates will have to use microstrip techniques in order to realize the full performance of these components. The end product can be embedded in existing 19" rack mount assemblies or standalone. It should usually be located as close as possible to the analog to digital converters.

The pseudorandom code 450 may be a modest size of 8 bits to 16 bits in order to economize on digital converter record overhead and ensure sufficient signal to noise ratio for very reliable autocorrelation processing. As an example, suppose the switch closure time is four times the sampling reference clock 493 and the trigger latency uncertainty is two times the sampling clock period, where the sampling clock period is the period of the analog to digital converter sampling reference clock 493. Then the pseudorandom code generator could be programmed to wait ten times the sampling clock period before transmission of an 8-bit code. This will mean that the resulting analog to digital converter records will appear as will be illustrated in the timing diagrams of FIG. 5. A quick look at the first 18-samples of each sample record and locating the start of the pseudorandom code by correlation will quickly reveal how each data record is to be indexed offset for subsequent combined processing alignment. The total triggering process results in a negligibly small 22 samples of storage overhead.

Figure 5:
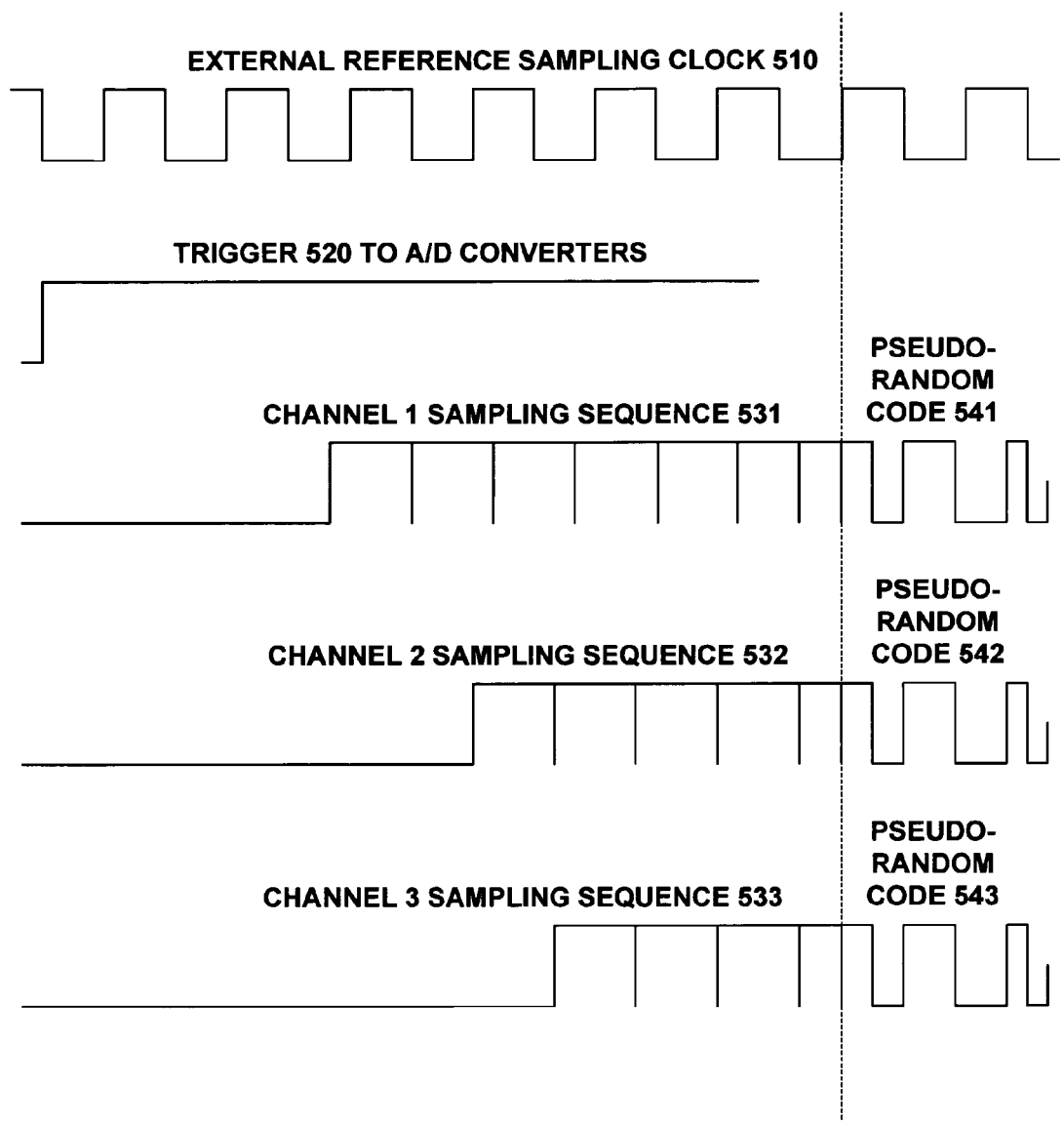
FIG. 5 illustrates exemplary diagrams illustrating the timing of analog to digital converter signals.

FIG. 5 illustrates exemplary diagrams illustrating the timing of analog to digital converter signals in a typical sequence of events. An external reference sampling clock 510 is illustrated. The external reference sampling clock is a continuous-wave (CW) input always present and applied. A trigger 520 is illustrated as sent to the analog to digital converters. Sampling sequences 531, 532 and 533 are illustrated for analog channels 1, 2 and 3. Pseudorandom codes 541, 542 and 543 are illustrated inserted in the sampling sequences 531, 532 and 533 at the output side of the analog to digital converters. The sample timing in FIG. 5 is an example case with a 4-sampling period clock latency, and a 10 cycle logic delay until transmission of the pseudorandom code.

When the trigger 520 occurs, the following events happen: the trigger 520 is distributed to the trigger inputs to the analog to digital converters and the synchronization control logic goes into action; the synchronization control logic commands the RF switches into the pseudorandom code input position, the synchronization control logic also counts down a worst-case latency time, after which, the control logic inserts the pseudorandom code into the analog to digital converter analog inputs; and the synchronization control logic then switches the RF switches back into the default analog input position, and is finished.

The present invention synchronizes multiple analog to digital converter channels independent of the particular analog to digital converter model, brand, or number used, and can easily be adapted to various clock rates or resolutions. The present invention allows the successful implementation of coherent integration and other forms of phase sensitive processing by satisfying the critical requirement of multiple analog to digital conversions that are time aligned.

Although the invention has been described and illustrated in the above description and drawings, it is understood that this description is by example only, and that numerous changes and modifications can be made by those skilled in the art without departing from the true spirit and scope of the inventions. Although the examples in the drawings depict only exemplary constructions and embodiments, alternate embodiments are available given the teachings of the present patent disclosure. The inventions are applicable to applications requiring coherency, which is being synchronous with an internal timer. Examples of coherent applications are radar, sonar, radio, and broadband communications.

We claim:

1. A synchronization circuit for analog to digital converters, comprising:
    a plurality of analog to digital converters for converting a respective plurality of analog signals to a respective plurality of digital signals;
    a pseudorandom code generator for generating a pseudorandom code;
    a plurality of switches operatively coupled between the plurality of analog signals and the plurality of analog to digital converters and between the pseudorandom code generator and the plurality of analog to digital converters to insert the pseudorandom code into the analog signals at a same time; and
    a timing circuit operatively coupled to the plurality of analog to digital converters to trigger the plurality of analog to digital converters to begin converting together.

2. A synchronization circuit according to claim 1, further comprising a further timing circuit operatively coupled to the plurality of analog to digital converters to clock the plurality of analog to digital converters together.

3. A synchronization circuit for analog to digital converters, comprising:
    a plurality of analog to digital converters for converting a respective plurality of analog signals to a respective plurality of digital signals;
    a pseudorandom code generator for generating a pseudorandom code;
    a plurality of switches operatively coupled between the plurality of analog signals and the plurality of analog to digital converters and between the pseudorandom code generator and the plurality of analog to digital converters to insert the pseudorandom code into the analog signals at a same time; and
    a plurality of correlator filters operatively coupled to receive respective digital signals from the respective analog to digital converters, to recognize the pseudorandom code in each of the respective plurality of digital signals, and to output the respective digital signals time-aligned with one another.

4. A synchronization circuit according to claim 3, further comprising a timing circuit operatively coupled to the plurality of analog to digital converters to trigger the plurality of analog to digital converters to begin converting together.

5. A synchronization circuit according to claim 3, further comprising a timing circuit operatively coupled to the plurality of analog to digital converters to clock the plurality of analog to digital converters together.

6. A synchronization circuit according to claim 3, wherein at least one of the analog to digital converters is different from other of the analog to digital converters by one or more of being different kinds of converters and having different intrinsic propagation timing characteristics.

7. A synchronization circuit according to claim 3,
wherein the analog to digital converters are hardware converters; and
wherein the plurality of correlator filters are implemented in software.

8. A method of synchronizing analog to digital converters the method comprising:
converting a plurality of analog signals to a respective plurality of digital signals using a respective plurality of analog to digital converters;
generating a pseudorandom code;
inserting the pseudorandom code into the respective analog signals at a same time prior to converting the plurality of analog signals to the respective plurality of digital signals; and
triggering the plurality of analog to digital converters to begin converting together.

9. A method of synchronizing analog to digital converters according to claim 8, further comprising clocking the plurality of analog to digital converters together.

10. A method of synchronizing analog to digital converters the method comprising:
converting a plurality of analog signals to a respective plurality of digital signals using a respective plurality of analog to digital converters;
generating a pseudorandom code;
inserting the pseudorandom code into the respective analog signals at a same time prior to converting the plurality of analog signals to the respective plurality of digital signals; and
correlation filtering respective digital signals from the respective analog to digital converters to recognize the pseudorandom code in each of the respective plurality of digital signals and output the respective digital signals time-aligned with one another.

11. A method of synchronizing analog to digital converters according to claim 10, further comprising triggering the plurality of analog to digital converters to begin converting together.

12. A method of synchronizing analog to digital converters according to claim 10, further comprising clocking the plurality of analog to digital converters together.

13. A method of time aligning analog signals converted to a plurality of digital signals using a respective plurality of analog to digital converters, comprising:
generating a pseudorandom code;
inserting the pseudorandom code into the respective analog signals at a same time prior to converting the plurality of analogs signals to the respective plurality of digital signals; and
correlation filtering respective digital signals to recognize the pseudorandom code in each of the respective plurality of digital signals and output the respective digital signals time-aligned with one another.

14. A method of time aligning according to claim 13, wherein the analog to digital converters are hardware converters and wherein the correlation filtering is implemented in software.

15. A method of time aligning according to claim 13, wherein the hardware converters are of at least two different kinds of converters having different intrinsic propagation timing characteristics.

16. A method of time aligning according to claim 13, further comprising triggering the plurality of analog to digital converters to begin converting together.

17. A method of time aligning according to claim 13, further comprising clocking the plurality of analog to digital converters together.

18. A synchronization circuit for analog to digital converters, comprising:
a plurality of analog to digital converters for converting a respective plurality of analog signals to a respective plurality of digital signals, wherein the analog to digital converters are hardware converters of at least two different kinds of converters having different intrinsic propagation timing characteristics;
a pseudorandom code generator for generating a pseudorandom code;
a plurality of switches operatively coupled between the plurality of analog signals and the plurality of analog to digital converters and between the pseudorandom code generator and the plurality of analog to digital converters to insert the pseudorandom code into the analog signals at a same time; and
a plurality of correlator filters operatively coupled to receive respective digital signals from the respective analog to digital converters, to recognize the pseudorandom code in each of the respective plurality of digital signals, and to output the respective digital signals time-aligned with one another.

* * * * *